(12) United States Patent
Liaw

(10) Patent No.: US 7,202,566 B2
(45) Date of Patent: Apr. 10, 2007

(54) CROSSED POWER STRAPPED LAYOUT FOR FULL CMOS CIRCUIT DESIGN

(75) Inventor: Jhon Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 139 days.

(21) Appl. No.: 11/002,536

(22) Filed: Dec. 2, 2004

(65) Prior Publication Data

US 2005/0121793 A1   Jun. 9, 2005

Related U.S. Application Data

(60) Provisional application No. 60/527,857, filed on Dec. 5, 2003.

(51) Int. Cl.
*H01L 23/48* (2006.01)

(52) U.S. Cl. ............ 257/758; 257/753; 257/779; 257/784; 257/760; 257/750; 257/690; 257/774; 257/775; 257/776

(58) Field of Classification Search ............ 257/758, 257/753, 778, 784, 760, 750, 690, 774, 775, 257/776
See application file for complete search history.

(56) References Cited

U.S. PATENT DOCUMENTS

| 6,180,495 | B1 * | 1/2001 | Wilson et al. ............ 438/455 |
| 6,417,032 | B1 * | 7/2002 | Liaw ..................... 438/153 |
| 6,479,845 | B2 | 11/2002 | Chen |
| 6,569,723 | B2 | 5/2003 | Liaw |
| 6,614,091 | B1 * | 9/2003 | Downey et al. ........... 257/499 |
| 6,642,081 | B1 * | 11/2003 | Patti ..................... 438/109 |
| 6,989,600 | B2 * | 1/2006 | Kubo et al. .............. 257/758 |

* cited by examiner

*Primary Examiner*—Douglas W. Owens
*Assistant Examiner*—Junghwa Im
(74) *Attorney, Agent, or Firm*—Haynes and Boone, LLP

(57) ABSTRACT

An integrated circuit device and method thereof includes a substrate and a plurality of microelectronic devices. Each of the microelectronics devices includes a patterned feature located over the substrate, wherein the pattern feature comprises at least one electrical contact. The integrated circuit also includes a plurality of interconnect layers for distributing electrical power to the plurality of microelectronic devices. The interconnect layers include a plurality of conductive members associated with each interconnect layer, wherein the members of at least one subsequent interconnect layer straddle members of at least one adjacent interconnect layer. The integrated circuit device further includes a plurality of bond pads connected to at least one of the plurality of members of the interconnect layers.

32 Claims, 5 Drawing Sheets

CROSSED POWER STRAPPED LAYOUT FOR FULL CMOS CIRCUIT DESIGN

CROSS-REFERENCE

This application is related to, and claims priority of, U.S. Provisional Patent Application Ser. No. 60/527,857, filed on Dec. 5, 2003.

TECHNICAL FIELD

The present disclosure relates generally to an integrated circuit device and method for fabrication, and more specifically to an integrated circuit device with straddled interconnects.

BACKGROUND

An integrated circuit (IC) is formed by creating one or more devices (e.g., circuit components) on a semiconductor substrate using a fabrication process. As fabrication processes and materials improve, semiconductor device geometries have continued to decrease in size since such devices were first introduced several decades ago. For example, current fabrication processes are producing devices having geometry sizes (e.g., the smallest component (or line) that may be created using the process) of less than 90 nm. However, the reduction in size of device geometries frequently introduces new challenges that need to be overcome.

As microelectronic devices are scaled below 90 nm, the electrical power efficiency and distribution become an issue that impacts device performance. The modern integrated circuit employs a plurality of conductive interconnect layers to provide distribution of electrical power to a plurality of microelectronics devices, however optimal device performance are not achieved with interconnect designs employed in many of the today's microelectronics products.

Accordingly, what is needed in the art is a integrated circuit device and method thereof that addresses the above discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
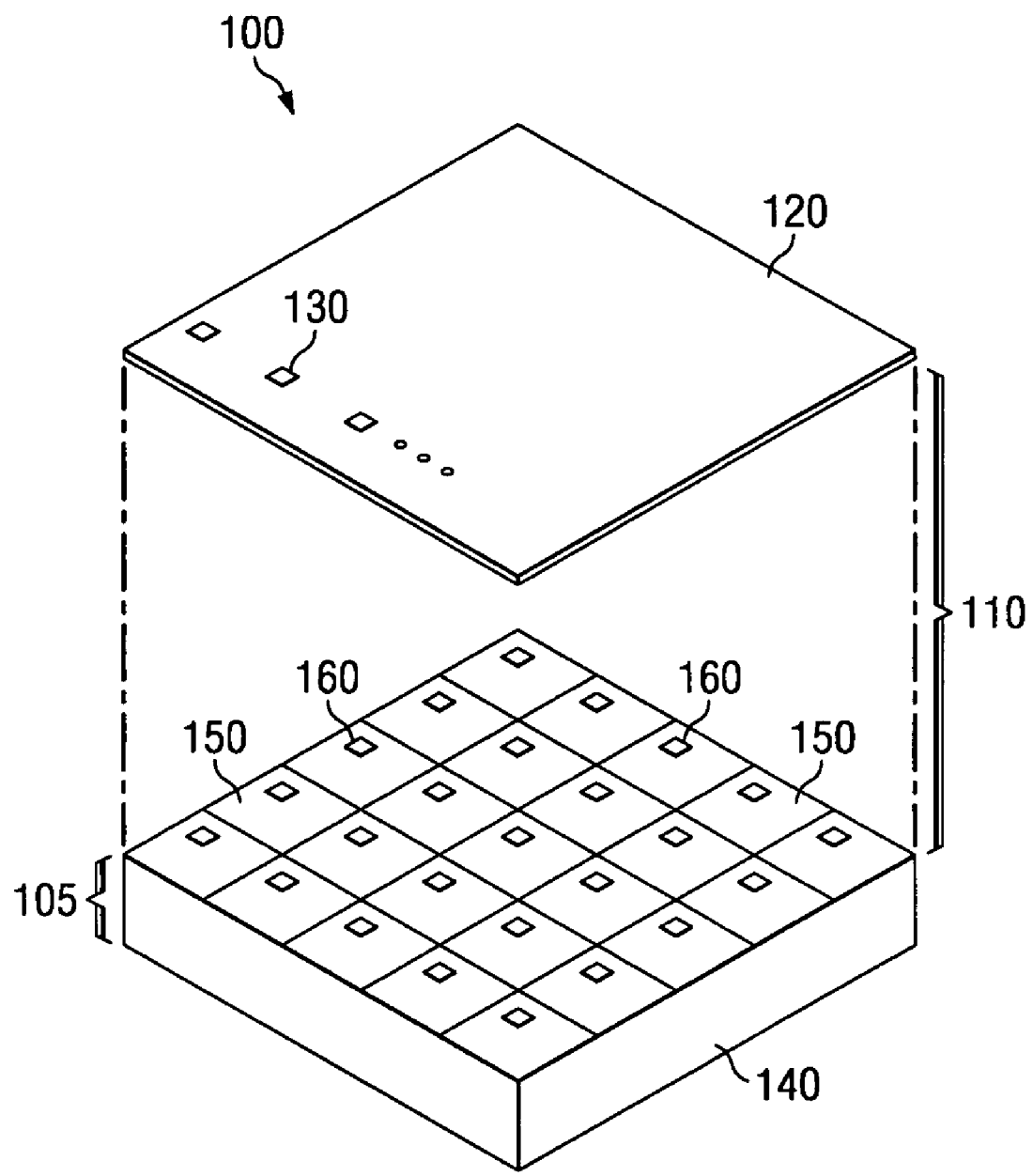
FIG. 1 illustrates a sectional view of one embodiment of a microelectronics integrated circuit device slice constructed according to aspects of the present disclosure.

The present disclosure relates generally to an integrated circuit device and method for fabrication, and more specifically to an integrated circuit device with straddled interconnects. It is understood that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a sectional view of one embodiment of a microelectronics integrated circuit device slice 100 constructed according to aspects of the present disclosure. The slice 100 comprises an interconnect space 110, a bond layer 120, a device layer 140, and a substrate 105.

The interconnect space 100 comprises a plurality of patterned conductive interconnect layers. The interconnect layers may comprise of conductive materials such as Cu, Al, Mo, MoSi, Ni, NiSi, TiN, TaN, Ti, Ta, SiC, CoSi, WSi, and/or other materials. The interconnect layers may also be encapsulated with low-k dielectric material.

The bond layer 120 comprises a plurality of conductive pads 130 surrounded by an insulating material. The pads 130 comprise conductive materials such as Pt, Al, Cu, Ag, Au, Ni, Mo, and/or other conductive materials. The pads 130 may also comprise a plurality of subordinate patterned features to provide a reduction in mechanical stress of the surrounding dielectric material. The subordinate patterned features may include a plurality of small blocks substantially smaller than the pads 130. The population of pads within the bond layer 120 may be characterized by the population of microelectronic devices 150, the chip (not shown) dimensions, the minimum device feature dimensions, the minimum device gate thickness, and/or other device parameters. For example, the chip dimensions may range between about 4 mm$^2$ and about 300 mm$^2$, the population of the microelectronic devices may range between about 40 million and about 10 billion, while the minimum device feature and thickness may range between about 3 Angstroms and about 1500 Angstroms. The gate dielectric thickness of microelectronic devices may range between about 3 Angstroms and about 30 Angstroms. Therefore, the pads 130 population may be scaled according to the integrated circuit device 100, wherein the pads 130 population may range between about 2 and about 512.

The device layer 140 comprises a plurality of microelectronics devices 150. The microelectronics devices 150 may be formed from, in or on a common substrate which may be substantially similar in composition and manufacture to the substrate 105. Of course, the integrated circuit device 100 may include other types of substrates 105, or multiple substrates, within the scope of the present disclosure. Each of the microelectronic devices 150 includes at least one electrical contact 160.

For example, each microelectronic device 150 may include one or more transistors, gates, an electrically programmable read only memory (EPROM) cell, an electrically erasable programmable read only memory (EEPROM) cell, a static random access memory (SRAM) cell, a dynamic random access memory (DRAM) cell and/or other microelectronic devices (hereafter collectively referred to as microelectronic devices).

The substrate 105, upon which the plurality of microelectronics devices 150 are formed, includes one or more layers of materials, structures, or other features. Each of which may be formed by various known methods, such as immersion photolithography, maskless photolithography, chemical-vapor deposition (CVD), physical-vapor deposition (PVD), plasma-enhanced CVD (PECVD), high density plasma CVD (HDP CVD), atomic layer deposition (ALD) and/or other process techniques. Conventional and/or future-developed lithographic, etching and other processes may be employed to define the integrated circuit device 100 from the deposited layers.

The substrate 105 may be a bulk silicon substrate or a silicon-on-insulator (SOI) substrate, and may comprise silicon, gallium arsenide, gallium nitride, strained silicon, silicon germanium, silicon carbide, carbide, diamond and/or other materials.

Figure 2:
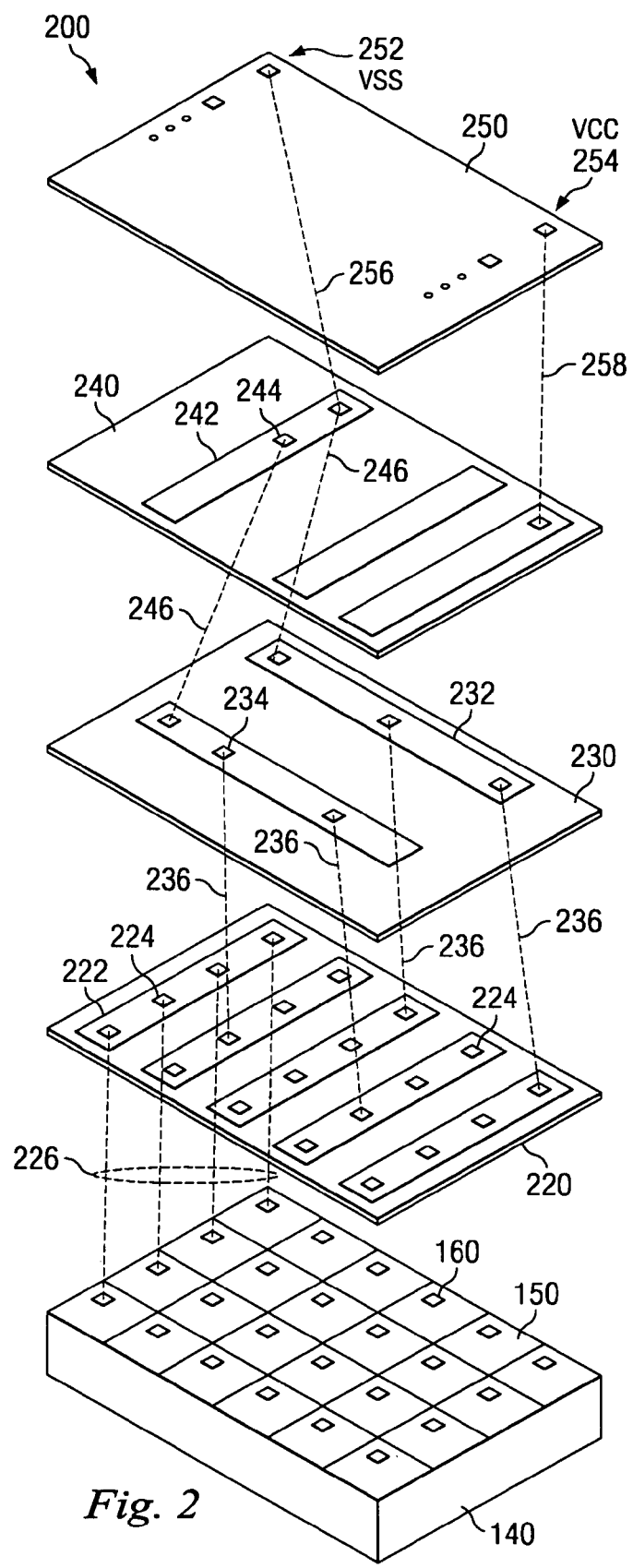
FIG. 2 illustrates a sectional view of one embodiment of partitioned cross strap interconnect structure constructed according to aspects of the present disclosure.

Referring to FIG. 2, a partitioned cross strap interconnect structure 200 includes the device layer 140 and a plurality of interconnect layers 220, 230, 240, ad 250. The layers 220, 230, and 240 include a plurality of conductive interconnect straps 222, 232, and 242. Each of the straps 222, 232, and 242 include a plurality of electrical contacts or vias 224, 234, and 244 to provide contact to the electrical contacts 160, and/or the other strap. The straps 222, 232, and 242 may be formed in a plurality of patterns, such as but not limited to rectangles, circles, or lines. The straps 222, 232, and 242 provide electrical signals or power (collectively power) to the plurality of microelectronic devices 150, wherein at least one strap of 222, 232, and 242 may provide an electrical ground potential $V_{ss}$, and/or an electrical potential $V_{cc}$ of an external power supply (not shown). Therefore, a population of each of the straps 222, 232, and 242 may provide the ground potential $V_{ss}$, and another population may provide the power supply potential $V_{cc}$. Additional internal or external power may also be provided. The straps 222, 232, and 242 may be directionally oriented within the layers 220, 230, and 240. For example, the straps 222 may be orthogonal relative to the straps 232 and/or may be congruent with the direction of the straps 242. Each of the straps 222, 232, and/or 242 may further connect to alternating microelectronics devices 150, and/or alternating other straps. Alternatively, the straps 222, 232, and/or 242 may be electrically isolated within the dielectric material encompassing the straps. The electrically isolated or "dummy" straps may provide stress relief and/or an indication of process completion, such as during chemical mechanical polishing (CMP) process.

In another embodiment, the pads 130 population for the ground potential $V_{ss}$ and/or the power supply potential $V_{cc}$ may scale according to the construction of the straps 222, 232, and 242 of the layers 220, 230, and 240. Therefore, the $V_{ss}$ pads 130 population may range between about 2 and about 512, and/or the $V_{cc}$ pads 130 population may range between about 2 and about 512. The population increase of the ground potential $V_{ss}$ and/or the power supply potential $V_{cc}$ pads 130 may provide substantial reduction in power leakage and noise, and more specifically, in microelectronics devices 150 with minimum features ranging between about 1500 Angstroms and about 3 Angstroms.

The layer 220, in one embodiment, includes a plurality of straps 222 electrically connected through vias 224 to the electrical contacts 160 of each of the microelectronics devices 150. This connection is shown in FIG. 2 with the dotted lines 226. Alternatively, the straps 222 may connect to alternating microelectronics devices 150, and may also straddle a plurality of microelectronics devices 150. For example, the strap 222 may connect to alternating microelectronics devices 150, wherein the alternating contact may be positioned horizontal and/or diagonal relative to the plane of the device layer 140. The alternating via 224 contact may be located at multiple alternating contacts 160 of the microelectronics devices 150, wherein the alternating vias 224 may occur every second, third, fourth, eight, twenty-four, thirty-two, sixty-four and/or other multiples within the strap 222. The minimum width of straps 222 may further have a width ranging between about 1600 Angstroms and about 5 Angstroms.

The layer 230, in one embodiment, includes a plurality of straps 232 electrically connected through vias 234 to the straps 222. This connection is shown in FIG. 2 with the dotted lines 236. Alternatively, the straps 232 may connect to alternating straps 222, and may also straddle a plurality of microelectronics devices 150 and/or the straps 222. For example, the strap 232 may connect to alternating microelectronics devices 150 and/or straps 222, wherein the alternating contact may be positioned horizontal and/or diagonal relative to the plane of the layer 230. The alternating via 234 contact may be located at multiple alternating straps 222, wherein the alternating vias 234 may occur every second, third, fourth, eight, twenty-four, thirty-two, sixty-four and/or other multiples within the strap 232. The minimum width of straps 232 may further have a width ranging between about 1800 Angstroms and about 5 Angstroms.

The layer 240, in one embodiment, includes a plurality of straps 242 electrically connected through vias 244 to the straps 232, and/or the straps 222. This connection is shown in FIG. 2 with the dotted lines 246. Alternatively, the straps 242 may connect to alternating straps 232, and may also straddle a plurality of microelectronics devices 150 and/or the straps 222 and 232. For example, the strap 242 may connect to alternating microelectronics devices 150 and/or straps 222 and 232, wherein the alternating contact may be positioned horizontal and/or diagonal relative to the plane of the layer 240. The alternating via 244 contact may be located at multiple alternating straps 232 and/or 222, wherein the alternating vias 244 may occur every second, third, fourth, eight, twenty-four, thirty-two, sixty-four and/or other multiples within the strap 242. The minimum width of straps 242 may further have a width ranging between about 2000 Angstroms and about 5 Angstroms.

The layer 250, in one embodiment, includes a plurality of $V_{ss}$ pads 252 and $V_{cc}$ pads 254 electrically connected to the straps 242, and/or the straps 232, 222. This connection is shown in FIG. 2 with the dotted lines 256 and 258.

Figure 3:
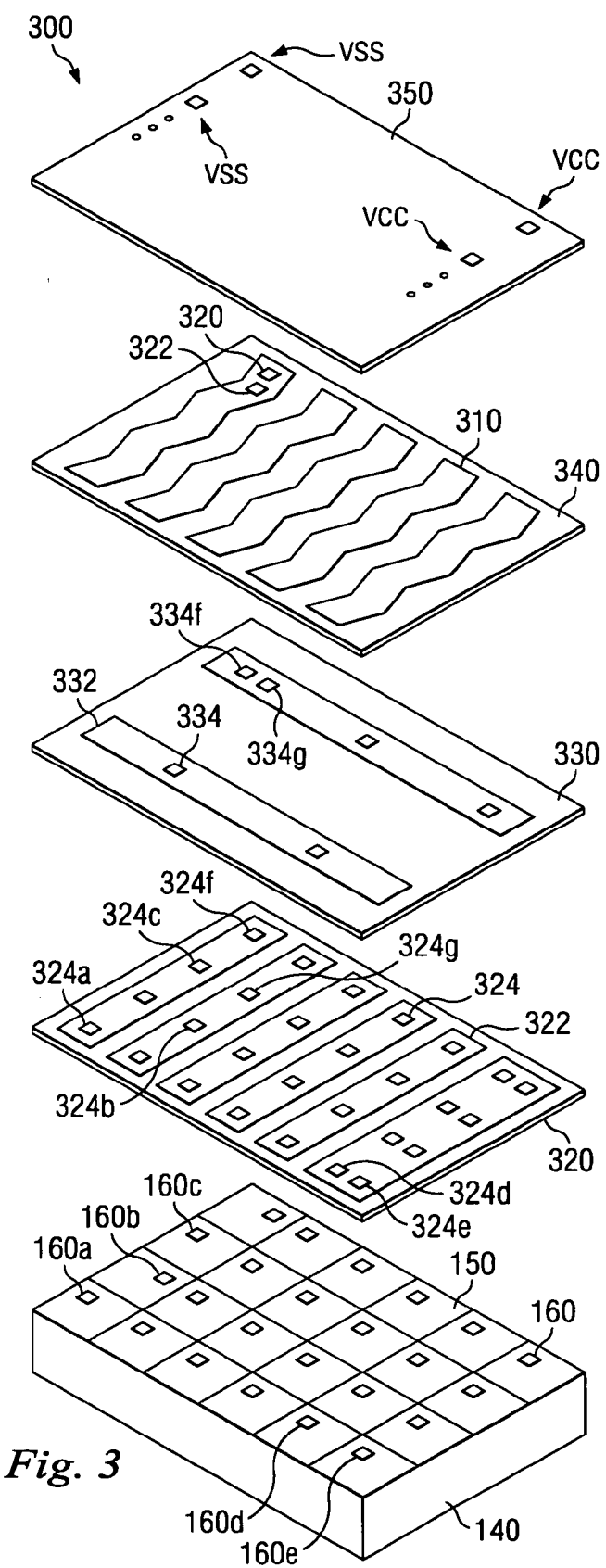
FIG. 3 illustrates a sectional view of another embodiment of partitioned corrugated cross strap interconnect structure constructed according to aspects of the present disclosure.

Referring to FIG. 3, another embodiment of a partitioned corrugated cross strap interconnect structure 300 includes the device layer 140, a plurality of interconnect layers 320, 330, 340, and 350.

The structure 300 may be configured similar to the structure 200, however the layers 320, 330, and/or 340 may comprise a plurality of corrugated straps 310. The corrugated straps 310 comprises an interconnect, wherein v-shaped grooves and/or valleys may be constructed within the depth of the integrated circuit device 100. The corrugated straps 310 provides for higher via 320–322 density, and further allows for reduced chip dimensions.

The structure 300 also contemplates the electrical connections between the plurality of interconnect layers 320, 330, 340, and 350. For example, via 320–322 may each be connected to via 334f–334g. In layer 330, via 334 may be connected to via 324a–324g. The electrical connects between layer 320 to the device layer 140 may comprise via 324a–324g may be connected to contacts 160a–160g. Alternatively, there may be multiple via 324d–324e connected to the contacts 160d–160e.

Figure 4:
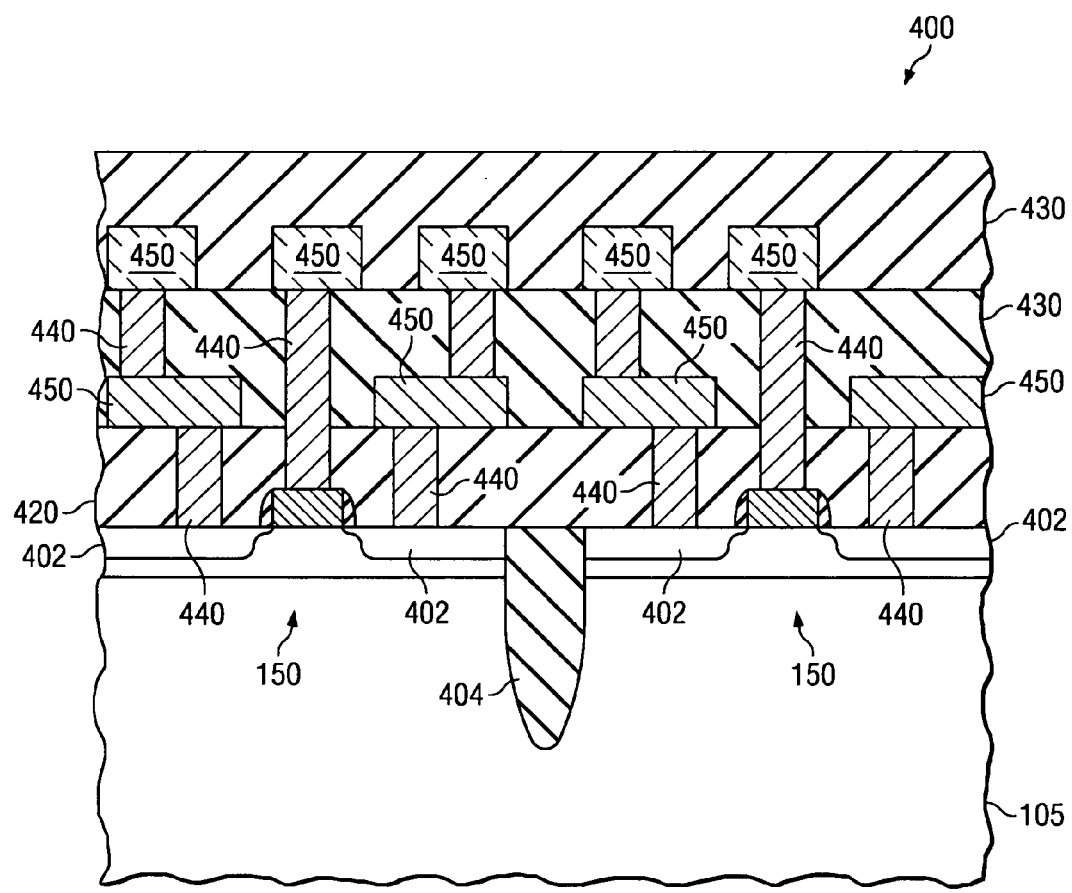
FIG. 4 illustrates a sectional view of an embodiment of an integrated circuit device constructed according to aspects of the present disclosure.

Referring to FIG. 4, an integrated circuit device 400 is one environment in which the microelectronics devices 150 and the straps 322, 332, and 342 may be incorporated. For example, the integrated circuit device 400 includes a plurality of microelectronics devices 150, wherein one or more of the microelectronics devices 150 may be substantially similar. The substrate 105 may also include one or more uniformly or complementary doped wells 402. While not limited to any particular dopant types or schemes, in one embodiment, the doped wells 402 employ boron (or BF2, or Indium, or combination) as a p-type dopant and P31 (or arsenic, or Sb, or combination) for an n-type dopant.

In one embodiment, the doped wells 402 may be formed using a high density plasma source with a carbon-to-deuterium ratio ranging between about 0.1 percent and about 5 percent in a vacuum process ambient. Boron doping may be provided by the mixing of a boron containing gas with a carbon/hydrogen gas. The boron containing gas may include $B_2H_6$, $B_2D_6$ and/or other boron containing gases. The concentration of boron doping may depend upon the amount of boron containing gas that may be leaked or added into the process. The process ambient pressure may range between 0.1 mTorr and about 500 Torr. The substrate 105 may be held at a temperature ranging between 150° C. and about 1100° C. The anneal equipment may be furnace, RTA, spike, coherent light irradiation and located on an ambient of O2, or N2, or H2O, or H2, or combination.

As described above, the doped wells 402 may also comprise n-type P31 (or arsenic, or Sb, or combination) dopant regions of the substrate 105. The above-described processes may also be employed to form lightly-doped source/drain regions in the substrate 105. Of course, other conventional and/or future-developed processes may also or alternatively be employed to form the source/drain regions.

The integrated circuit device 400 also includes one or more insulating layers 420, 430 located over the microelectronics devices 150. The first insulating layer 420, which may itself comprise multiple insulating layers, may be planarized to provide a substantially planar surface over the plurality of microelectronics devices 150.

The integrated circuit device 400 also includes vertical interconnects 440, such as conventional vias or contacts, and horizontal interconnects 450 (all spatial references herein are for the purpose of example only and are not meant to limit the disclosure). The interconnects 440 may extend through one or more of the insulating layers 420, 430, and the interconnects 450 may extend along one of the insulating layers 420, 430 or a trench formed therein. In one embodiment, one or more of the interconnects 440, 450 may have a dual-damascene structure. The interconnects 440, 450 may be formed by etching or otherwise patterning the insulating layers 420, 430 and subsequently filling the pattern with refractive and/or conductive material, such as tantalum nitride, copper and aluminum.

Figure 5:
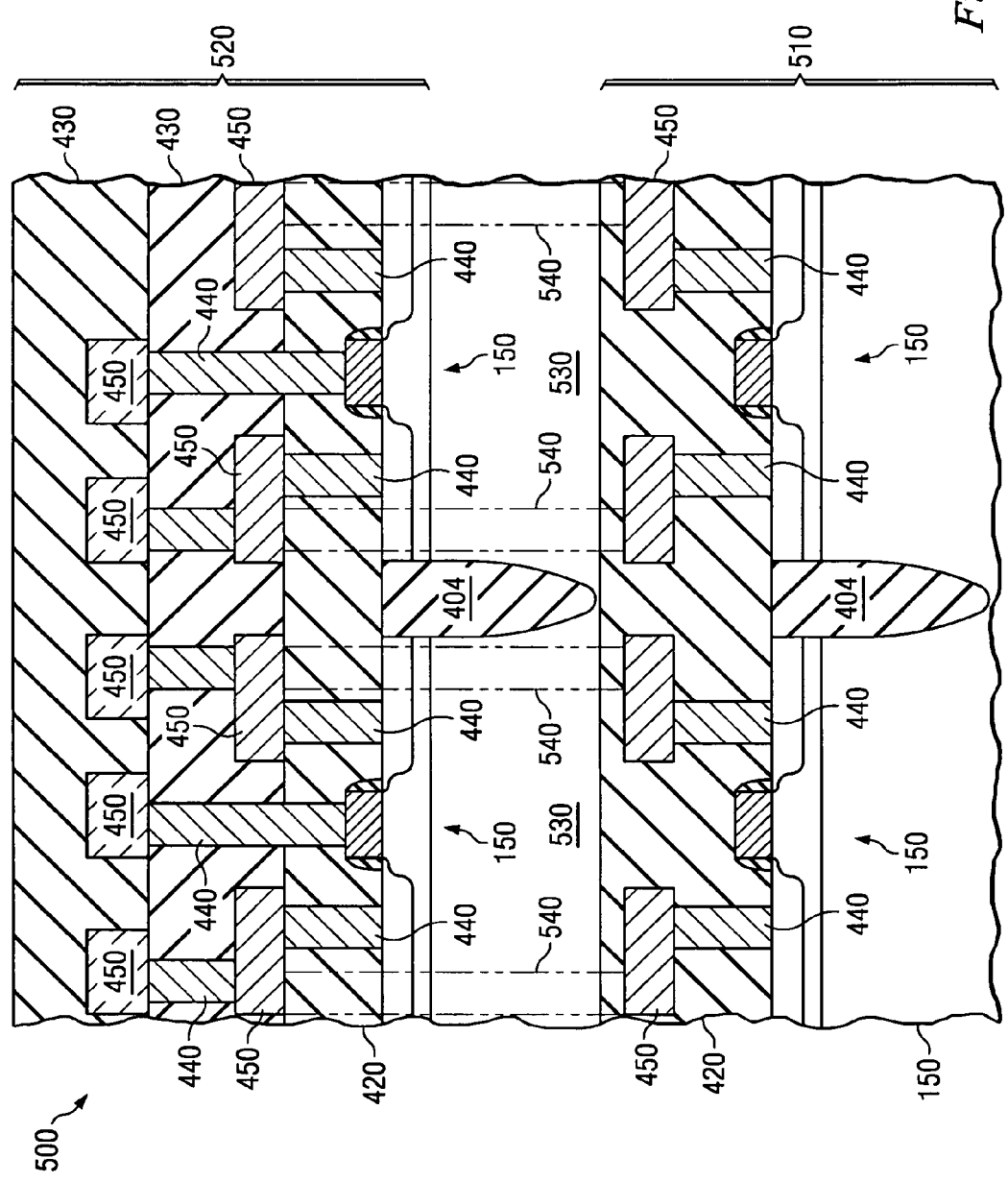
FIG. 5 illustrates a sectional view of another embodiment of an integrated circuit device constructed according to aspects of the present disclosure.

Referring to FIG. 5, illustrated is a sectional view of one embodiment of an integrated circuit device 500 constructed according to aspects of the present disclosure. The integrated circuit device 500 is another environment in which a microelectronics devices 150, and the straps 222, 232, and 242 may be incorporated. For example, the integrated circuit device 500 includes a plurality of microelectronics devices 150, wherein one or more of the microelectronics devices 150 may be substantially similar. The integrated circuit device 500 may include a plurality of device layers 510 and 520. The layer 510 and 520 may be fabricated by similar methods utilized for fabricating the integrated circuit device 400 and/or 100, as may be well known by one skilled in the art.

The integrated circuit device 500 further comprises a stack layer 530. The stack layer 530 comprises a plurality of transition interconnects 540 and a plurality of materials for isolating the layers 510 and 520. The stack layer 530 may comprise a low-k dielectric material such as $SiO_2$, fluorine content oxide, carbon content oxide, SiN, SiC, and/or other materials. The stack layer 530 may also comprise a silicon and/or semiconductor layer to provide the foundation for the fabrication of the layer 520.

The transition interconnects 540 comprise a plurality of conductive interconnects and/or straps to interconnect the layers 510 and 520. In one embodiment, one or more of the transition interconnects 540 may have a dual-damascene structure. The transition interconnects 540 may be formed by etching or otherwise patterning the stack layer 530, and subsequently filling the pattern with refractive and/or conductive material, such as tantalum nitride, germanium, doped silicon, copper and/or aluminum.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. An integrated circuit device, comprising:
   a substrate;
   a plurality of microelectronic devices, each comprising a patterned feature located over the substrate, wherein the patterned feature comprises at least one electrical contact;
   a plurality of interconnect layers, each comprising a plurality of conductive members configured for distributing electrical power to one of the plurality of microelectronic devices, wherein the plurality of interconnect layers includes
      a first, second, and third interconnect layers, with the third interconnect layer adjacent the second interconnect layer and the second interconnect layer adjacent the first interconnect layer;
      the plurality of conductive members of the third interconnect layer straddle the plurality of conductive members of the second interconnect layer; and
      the plurality of conductive members of the second interconnect layer straddle the plurality of conductive members of the first interconnect layer; and
   a plurality of bond pads each connected to at least one of the plurality of conductive members of one of the plurality of interconnect layers.

2. The integrated circuit device of claim 1 wherein the conductive members of selected portions of the plurality of interconnect layers are electrically connected to an electrical ground potential.

3. The integrated circuit device of claim 1 wherein a minimum width of said plurality of interconnect layers is less than 0.16 um.

4. The integrated circuit device of claim 1 wherein said plurality of 2 bond pads comprises at least bond pads connected to a ground potential power strap.

5. The integrated circuit device of claim 1 wherein a minimum gate dielectric thickness of said plurality of microelectronic devices is less than 16 Angstroms.

6. The integrated circuit device of claim 1 wherein the members of selected portions of the interconnect layer are electrically connected to an electrical potential.

7. The integrated circuit device of claim 1 wherein said plurality of bond pads comprises at least 2 bond pads connected to an electrical potential power strap.

8. The integrated circuit device of claim 1 wherein said plurality of interconnect layers electrically connect to at least one contact of each of the microelectronic devices.

9. The integrated circuit device of claim 1 wherein
the plurality of conductive members of the first interconnect layer electrically contact to at least one of the plurality of microelectronic device;
the plurality of conductive members of the second interconnect layer are orthogonally aligned relative to and electrically contact the plurality of conductive members of the first interconnect layer;
the plurality of conductive members of the third interconnect layer are orthogonally aligned relative to and electrically contact the plurality of conductive members of the second interconnect layer; and
a plurality of vias for interconnecting the first interconnect layer to the second interconnect layer, and interconnecting the third interconnect layer to the second interconnect layer.

10. The integrated circuit device of claim 9 wherein the vias provide alternating connections to contacts of the first level, and wherein the connections alternate in a range between about one and about sixty-four.

11. The integrated circuit device of claim 9 wherein a minimum width of said first layer is less than 0.16 um.

12. The integrated circuit device of claim 9 wherein a minimum width of said second layer is less than 0.18 um.

13. The integrated circuit device of claim 9 wherein a minimum width of said third layer is less than 0.2 um.

14. The integrated circuit device of claim 2 wherein a population of said plurality of bond pads associated with the ground potential range between about 2 and about 512.

15. The integrated circuit device of claim 6 wherein a population of said plurality of bond pads associated with the electrical potential range between about 2 and about 512.

16. The integrated circuit device of claim 1 wherein said substrate comprises diamond.

17. The integrated circuit device of claim 1 wherein said substrate comprises strained silicon.

18. The integrated circuit device of claim 1 wherein said substrate comprises silicon carbide.

19. A method of manufacturing an integrated circuit device, comprising:
providing a substrate;
forming a plurality of microelectronic devices each comprising a patterned feature located over the substrate, wherein the patterned feature comprises at least one electrical contact;
forming a plurality of interconnect layers, each comprising a plurality of conductive members configured for distributing electrical power to one of the plurality of microelectronic devices, wherein the plurality of interconnect layers includes
a first, second, and third interconnect layers, with the third interconnect layer adjacent the second interconnect layer and the second interconnect layer adjacent the first interconnect layer;
the plurality of conductive members of the third interconnect layer straddle the plurality of conductive members of the second interconnect layer; and
the plurality of conductive members of the second interconnect layer straddle the plurality of conductive members of the first interconnect layer; and
providing a plurality of bond pads each connected to at least one of the plurality of conductive members of one of the plurality of interconnect layers.

20. The method of claim 19 wherein the members of selected portions of each of said interconnect layers are electrically connected to a ground potential.

21. The method of claim 19 wherein a minimum width of said interconnect layers is less than 0.18 um.

22. The method of claim 19 wherein said plurality of bond pads comprises at least 16 bond pads for a ground potential power strap.

23. The method of claim 19 wherein the members of selected portions of each of the interconnect layers are electrically connected to an electrical potential.

24. The method of claim 19 wherein the interconnects of selected portions of the interconnect layers electrically connect to at least one contact of each of the microelectronic devices.

25. The method of claim 19 wherein the step of forming a plurality of interconnect layers includes:
providing a first layer comprising conductive members electrically contacting at least one microelectronic device;
forming a second layer comprising conductive members orthogonally aligned relative to the conductive members of the first layer, the conductive members of the second layer electrically contacting the conductive members of the first layer;
forming a third layer comprising conductive members orthogonally aligned relative to the conductive members of the second layer, the conductive members of the third layer electrically contacting the conductive members of the second layer; and
providing a plurality of vias for interconnecting the first layer to the second layer, and interconnecting the third layer to the second layer.

26. The method of claim 25 wherein the conductors of the first interconnect layer contact at least one contact of each of the microelectronic devices.

27. A three-dimensional integrated circuit device, comprising:
a substrate;
a plurality of microelectronic device layers, the layers each comprising a plurality of microelectronic devices, and a plurality of interconnect layers for distributing electrical power to the plurality of microelectronic devices, wherein the plurality of interconnect layers, each comprising a plurality of conductive members configured for distributing electrical power to one of the plurality of microelectronic devices, wherein the plurality of interconnect layers includes
a first, second, and third interconnect layers, with the third interconnect layer adjacent the second interconnect layer and the second interconnect layer adjacent the first interconnect layer;
the plurality of conductive members of the third interconnect layer straddle the plurality of conductive members of the second interconnect layer; and the plurality of conductive members of the second interconnect layer straddle the plurality of conductive members of the first interconnect layer; and a transition interconnect layer comprising a plurality of conductive interconnects for electrically connecting the device layers; and a plurality of bond pads connected to at least one of the plurality of conductive members of the device layers.

28. The three-dimensional integrated circuit device of claim 27 wherein the microelectronics device includes a patterned feature located within the device layers, wherein the pattern feature comprises at least one electrical contact.

29. A three-dimensional integrated circuit device, comprising:

a substrate;

a plurality of microelectronic device layers, the layers each comprising a plurality of microelectronic devices, and a plurality of interconnect layers for distributing electrical power to the plurality of microelectronic devices;

a transition interconnect layer comprising a plurality of conductive interconnects for electrically connecting the device layers; and a plurality of bond pads connected to at least one of the plurality of members of the device layers, wherein the transition layer further comprises:

a dielectric layer formed substantially over at least one device layer;

a first semiconductor layer comprising silicon;

a conductive seed layer comprising a metal over the first semiconductor layer; and a second semiconductor layer comprising silicon.

30. An integrated circuit comprising:

a plurality of static random access memory (SRAM) cells;

a plurality of dielectric layers containing metal conductor lines and metallization layers over the SRAM cells;

a first potential strap/conductor in a first direction in a first metallization layer and connected to a potential node of the SRAM cells, the first potential strap/conductor having a minimum line width less than 135 nm;

a second potential strap/conductor in a second direction in a second one of the metallization layers;

a VIA/contact between the potential node and the first and second potential strap/conductors;

at least 25 pads potential bond pads for connecting to one or more of the metallization layers.

31. The integrated circuit of claim 30 wherein the potential bond pads are Vss bond pads and the first and second potential strap/conductors are Vss strap/conductors.

32. The integrated circuit of claim 30 wherein the potential bond pads are Vcc bond pads and the first and second potential strap/conductors are Vcc strap/conductors.

* * * * *